(12) United States Patent
Straub et al.

(10) Patent No.: US 6,891,440 B2
(45) Date of Patent: May 10, 2005

(54) QUADRATURE OSCILLATOR WITH PHASE ERROR CORRECTION

(76) Inventors: A. Michael Straub, 114 Boskind Rd., Indialantic, FL (US) 32903; John S. Prentice, 881 Vance Cir. NE., Palm Bay, FL (US) 32905

(*) Notice: Subject to any disclaimer, the term of this patent is extended or adjusted under 35 U.S.C. 154(b) by 675 days.

(21) Appl. No.: 09/747,163

(22) Filed: Dec. 21, 2000

(65) Prior Publication Data

US 2002/0039052 A1 Apr. 4, 2002

Related U.S. Application Data

(63) Continuation-in-part of application No. 09/677,975, filed on Oct. 2, 2000.

(51) Int. Cl.$^7$ .......................... H03L 07/00; H03B 27/00
(52) U.S. Cl. .......................... 331/1 R; 331/45; 327/238
(58) Field of Search .......................... 331/1 R, 45, 74, 331/75; 327/238, 254, 255

(56) References Cited

U.S. PATENT DOCUMENTS

| | | | |
|---|---|---|---|
| 3,828,249 A | | 8/1974 | Alber et al. |
| 4,028,626 A | | 6/1977 | Motley et al. |
| 4,164,036 A | | 8/1979 | Wax |
| 4,951,000 A | * | 8/1990 | Dautriche .................. 327/236 |
| 5,264,798 A | | 11/1993 | Bey, Jr. et al. |
| 5,573,001 A | | 11/1996 | Petrofsky et al. |
| 5,608,796 A | * | 3/1997 | Banu et al. .................. 379/403 |
| 5,659,263 A | | 8/1997 | Dow et al. |
| 5,742,622 A | | 4/1998 | Claydon et al. |
| 5,896,053 A | | 4/1999 | Prentice |
| 6,029,059 A | * | 2/2000 | Bojer .......................... 455/326 |
| 6,157,235 A | | 12/2000 | Bautista et al. |
| 6,172,543 B1 | * | 1/2001 | Kurisu ........................ 327/255 |
| 6,356,131 B1 | * | 3/2002 | Kuwano ...................... 327/255 |

FOREIGN PATENT DOCUMENTS

| | | |
|---|---|---|
| CN | 312072 | 8/1997 |
| FR | 2 670 975 A | 6/1992 |

OTHER PUBLICATIONS

A. Abidi, "Direct–Conversion Radio Transceivers for Digital Communications", *IEEE Journal of Solid–State Circuits*, vol. 30, No. 12, Dec. 1995, pp. 1399–1410.

(Continued)

*Primary Examiner*—David Mis
(74) *Attorney, Agent, or Firm*—Gary R Stanford (57) ABSTRACT

A quadrature oscillator with phase error correction including a local oscillator that generates a single-ended clock signal, a single-ended to differential converter that converts the clock signal to a differential clock signal, a quadrature generator that converts the differential clock signal into I and Q carrier signals, a phase error detector that measures a phase error between the I and Q carrier signals, and a feedback amplifier that modifies the differential clock signal based on measured phase error. The feedback amplifier applies the measured phase error as a DC offset to an AC differential clock signal. A transconductor converts the differential clock voltage signal into two pairs of differential current clock signals, where the quadrature generator generates I and Q current signal outputs from the two pairs of differential current clock signals. The phase error detector generates a phase error voltage, and the feedback amplifier includes a transconductance stage that converts phase error voltage into a DC correction current and that adds the correction current to each of the two pairs of AC differential current clock signals.

21 Claims, 9 Drawing Sheets

OTHER PUBLICATIONS

B. Razavi, "Design Considerations for Direct–Conversion Receivers", *IEEE Transactions on Circuits and Systems—II: Analog and Digital Signal Processing, vol 44, No. 6,* Jun. 1997, pp. 428–435.

J. Cavers et al., "Adaptive Compensation for Imbalance and Offest Losses in Direct Conversion Transceivers", *IEEE Transactions on Vehicular Technolgy, vol. 42, No. 4,* Nov. 1993, pp.581–588.

A. Bateman et al., "Direct Conversion Transceiver Design for Compact Low–Cost Portable Mobile Radio Terminals", *IEEE Veh. Tech. Conf.,* 1989, pp. 57–62.

S. Sampei et al., "Adaptive DC–Offest Compensation Algorithm for Burst Mode Operated Direct Conversion Receivers", IEEE Veh. Tech. Conf., 1992, pp. 93–96.

PCT Notification of Transmittal of International Search Report or the Declaration, dated Aug. 5, 2002, 6 pages.

* cited by examiner

QUADRATURE OSCILLATOR WITH PHASE ERROR CORRECTION

CROSS-REFERENCE TO RELATED APPLICATION(S)

The present application is a continuation-in-part (CIP) of U.S. patent application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety. The present application is related to U.S. patent application entitled "System And Method For Detecting And Correcting Phase Error Between Differential Signals", Ser. No. 09/747,138, filed concurrently herewith, which is hereby incorporated by reference in its entirety.

FIELD OF THE INVENTION

The present invention relates to modulation techniques, and more particularly to a quadrature oscillator with phase error correction that provides in-phase (I) and quadrature phase (Q) carrier signals.

DESCRIPTION OF RELATED ART

Many small networks are commonly connected through a set of wires. Wired networks provide a certain level of convenience but have many limitations such as various cable management and convenience issues. For various reasons, wireless LAN (WLAN) technology is becoming more popular. Radio frequency (RF) appears to be the technology of choice for establishing a viable WLAN. The typical environment for wireless communications, however, is very noisy and not optimal for communications. For example, most homes and workplaces include many electronic devices resulting in an electronically noisy environment that may interfere with WLAN communications, such as microwave ovens, garage door openers, radios, television sets, computer systems, etc. Further, the communication medium between wireless devices is dynamic and constantly changes. For example, most environments or rooms include multiple reflective services, creating multipath noise. Movement of items or devices or the like such as hands, bodies, jewelry, mouse pointers, etc., or activation of electronic devices, such as cooling fans or the like, affects the overall wireless communication path and potentially degrades wireless communication performance. In summary, wireless communications must be made through a dynamic and unpredictable medium.

In spite of the limitations of the wireless medium, consumers are demanding high-speed wireless applications and relatively high quality of service (QOS) applications. Such applications include media streams, which further include any combination of video and audio information and other data. Because of the dynamic and unpredictable environment through which wireless communications must be made, wireless communications are generally less robust and less reliable than corresponding wired communications. Also, a significant amount of overhead is required for successful wireless communications. For example, frames or packets of information submitted through the wireless media typically include a known preamble to enable the receiving device to measure the noise and distortion effects of the wireless medium. Collision detection techniques, such as commonly used in Ethernet wired environments, are not particularly useful in wireless communications since a transceiver is unable to receive a signal while transmitting. Therefore, many rules and timing constraints must be followed for wireless devices to communicate with each other in half duplex mode.

It is imperative that wireless transceivers utilize the wireless medium in the most efficient manner possible to maximize data throughput and to meet bandwidth requirements. In one technique, information is encoded onto an RF carrier by modulating the amplitude and phase angle. The phase modulation/demodulation is achieved by using pairs of mixers driven by quadrature local oscillator (LO) signals. The two phases of the local oscillator, designated I (in-phase) and Q (quadrature phase), are at the same frequency, but the Q phase is intended to be delayed one quarter cycle or period (90 degrees) with respect to the I phase carrier signal. The amount of data that can be transmitted at a given carrier frequency is proportional to the accuracy of the I/Q phase relationship.

In an exemplary embodiment, the two local oscillator phases are derived from a single voltage controlled oscillator (VCO) to obtain coherency. However, imperfections in the quadrature generation and/or distribution circuits typically cause quadrature phase errors. In order to obtain high data transmission rates, the I/Q phase relationship must not deviate from 90 degrees by more than few degrees. This has proven difficult to achieve in typical wireless transceiver configurations. For example, with a local oscillator frequency of 2.5 gigahertz (GHz), a timing error of 1.1 picoseconds (ps) is equivalent to one degree of phase error. Within the transceiver circuitry, a mismatch in parasitic capacitance of 11 fempto Farads (fF) across a 100-ohm resister can generate a one-degree phase error. An $f_\tau$ mismatch of a bipolar junction transistor (BJT) of ten percent may also generate a degree phase error at RF.

It is desired to detect and reduce or otherwise eliminate phase errors between the I/Q carrier signals of a quadrature oscillator in order to increase the amount of data that can be transmitted in accordance with the RF quadrature modulating technique.

SUMMARY OF THE INVENTION

A quadrature oscillator with phase error correction according to an embodiment of the present invention includes a local oscillator that generates a single-ended clock signal, a single-ended to differential converter that converts the single-ended clock signal to a differential clock signal, a quadrature generator that converts the differential clock signal into an in-phase (I) carrier signal and a quadrature (Q) carrier signal, a phase error detector that measures a phase error between the I and Q carrier signals and that provides a phase error signal, and a feedback amplifier that modifies the differential clock signal based on measured phase error. In particular embodiments, the single-ended to differential converter includes a second stage that generates a pair of differential clock signals. The quadrature generator divides the frequency by two. The feedback amplifier applies the measured phase error as a DC offset to an AC differential clock signal.

In another embodiment, the local oscillator asserts the single-ended clock signal as a voltage signal and the single-ended to differential converter asserts the differential clock signal as a differential voltage signal. A transconductor is provided that converts the differential clock voltage signal into two pairs of differential current clock signals. In this case, the quadrature generator is a master-slave latch (or flip-flop) configuration that generates I and Q current signal outputs from the two pairs of differential current clock signals. The transconductor may be implemented as a dual pair of common-emitter coupled transistors and a current source coupled between the emitters of each of the dual pair of transistors and ground. Each of the transistors pairs has a base input receiving a component of the differential clock signal and a pair of collectors that generate a corresponding one of the two pairs of differential current clock signals. The phase error detector generates a phase error voltage indicative of phase error between the I and Q carrier signals. The feedback amplifier includes a transconductance stage that converts a phase error voltage into a correction current and that adds the correction current to each of the two pairs of differential current clock signals.

The quadrature oscillator may further include first and second chains of buffers that amplify the I and Q current signal outputs, respectively, to provide the I and Q carrier signals. The transconductance stage may include MOSFET current sources that convert the phase error voltage to DC current offsets. Further, the feedback amplifier may include an RC filter and an amplifier stage, where the amplifier stage amplifies the phase error voltage.

In another alternative embodiment, the phase error detector includes first and second mode buffers, first and second phase error detectors and a mode switch. The first mode buffer generates first mode I and Q carrier signals and the second mode buffer generates second mode I and Q carrier signals. The first phase error measures a phase error between the first mode I and Q carrier signals and provides a first mode phase error signal. The second phase error detector measures a phase error between the second mode I and Q carrier signals and provides a second mode phase error signal. The mode switch couples the first phase error detector to the feedback amplifier in a first mode and couples the second phase error detector to the feedback amplifier in a second mode. This embodiment is advantageous, for example, for a multi-mode integrated circuit (IC), such as for a half-duplex RF communication device or the like.

A quadrature oscillator with phase error correction according to another embodiment of the present invention includes a single-ended to differential converter that converts a single-ended clock signal to a differential clock signal, a transconductor that converts the differential clock signal into a pair of differential clock signals, a quadrature generator that converts the pair of differential clock signals into an I clock signal and a Q clock signal, a first chain of buffers that develops an I carrier signal as a corrected version of the I clock signal, a second chain of buffers that develops a Q carrier signal as a corrected version of the Q clock signal, a phase error detector that measures a phase error between the I and Q carrier signals and that provides a phase error signal, a feedback amplifier that receives the phase error signal and that generates a differential feedback signal, and a pair of tuning elements. Each tuning element is coupled to the feedback amplifier and to a respective one of intermediate feedback junctions of the first and second chain of buffers. Each of the pair of tuning elements may comprise a tunable RC circuit. In a more particular embodiment, each tuning element includes a series resistance coupled between successive buffers of the chain of buffers and a tunable varactor coupled to the resistance and the feedback amplifier.

A quadrature oscillator with phase error correction includes a clock generator, a clock splitter, first and second phase shifting networks and a phase detector. The clock generator provides a clock signal and the clock splitter splits the clock signal into first and second clock signals. The first phase shifting network develops a first carrier signal based on the first clock signal and the second phase shifting network develops a second carrier signal based on the second clock signal, where the second clock signal is one quarter phase shifted relative to the first carrier signal. The phase detector asserts a phase error signal used to control the phase shifting networks. In one embodiment, the quadrature oscillator includes a combiner coupled to the phase detector and the clock splitter that adjusts the first and second clock signals based on the phase error signal. In another embodiment, the first and second phase shifting networks each develop a respective one of first and second intermediate carrier signals, and a combiner is added to adjust the first and second intermediate carrier signals based on the phase error signal.

A method of generating quadrature signals with phase error correction according to an embodiment of the present invention includes generating a clock signal, converting the clock signal into a differential clock signal, splitting the clock signal into first and second clock signals, developing an in-phase (I) differential carrier signal and a quadrature phase (Q) differential carrier signal based on the first and second clock signals, detecting phase error between the I and Q differential carrier signals, generating a phase error feedback signal and adjusting the phase differential between the I and Q differential carrier signals based on the phase error feedback signal. The adjusting the phase differential may include combining the phase error feedback signal with the first and second clock signals. Alternatively, the method includes generating intermediate I and Q differential carrier signals within a chain of buffers and combining the phase error feedback signal with the intermediate I and Q differential carrier signals.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENT(S) OF THE INVENTION

Figure 1:
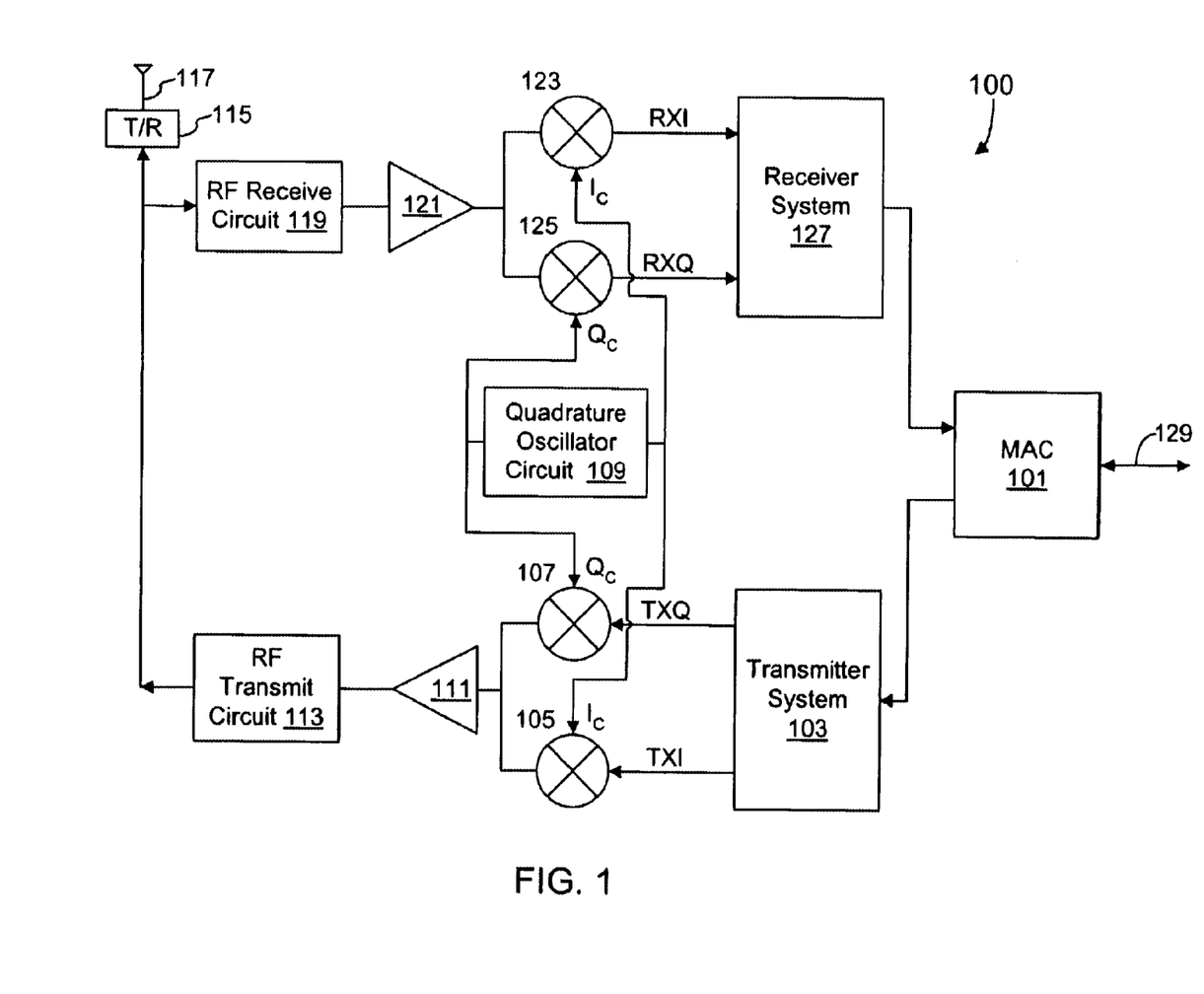
FIG. 1 is a simplified block diagram of an exemplary wireless transceiver that includes a phase error detector implemented according to an embodiment of the present invention.

FIG. 1 is a simplified block diagram of an exemplary wireless transceiver 100 that includes a quadrature oscillator circuit 109 with phase error correction implemented according to an embodiment of the present invention. The wireless transceiver 100 may utilize any desired carrier frequency and modulation technique to achieve any of the several corresponding data throughputs. For example, the wireless transceiver 100 may be configured to operate according to the Institute of Electrical and Electronics Engineers (IEEE) 802.11b with a carrier frequency of approximately 2.4 gigahertz (GHz) and with data throughputs of 1, 2, 5.5 or 11 megabits per second (Mbps). Alternatively, the wireless transceiver 100 may be configured according to IEEE 802.11a with a carrier frequency of approximately 5 GHz for achieving data throughputs of 6, 12, 24, 36 or 54 megabits per second (Mbps). The direct sequence spread spectrum (DSSS) modulation technique may be used, although many communication and modulation techniques and standards are contemplated. It is appreciated that the present invention is not limited to the specific embodiments described herein and may be applied to any type of wireless transceiver employing quadrature phase modulation techniques.

Digital data sent from or received by the wireless transceiver 100 via an interface 129 is processed through a medium access control (MAC) device 101. For transmission, the MAC device 101 asserts digital data signals to a transmitter system 103, which includes an encoder (not shown) that formulates the data into packets for transmission, and a spreading encoder (not shown) that uses a quadrature generation technique to provide in-phase (I) and quadrature phase (Q) signals on respective I and Q channels. The spreading decoder is configured in accordance with any one of various known spreading algorithms. The I and Q channel signals are provided to respective digital-to-analog converters (DACs) (not shown) that assert respective I and Q channel analog signals. The I and Q channel analog signals are filtered by the transmitter system 103, which provides corresponding TXI and TXQ signals, respectively, to respective inputs of an I channel mixer 105 and a Q channel mixer 107.

The quadrature oscillator circuit 109 generates two separate RF carrier signals, including an in-phase carrier signal $I_C$ in a quadrature phase carrier signal $Q_C$. The $I_C$ and $Q_C$ carrier signals are intended to be 90 degrees out of phase with respect to each other (i.e., a quarter cycle or period differential). The $I_C$ signal is provided to another input of the I channel mixer 105 and the $Q_C$ signal is provided to another input of the Q channel mixer 107. The I channel mixer 105 combines the $I_C$ signal with the TXI signal to up-convert the I channel transmission signal to the desired RF range for transmission. The Q channel mixer 107 combines the $Q_C$ signal with the TXO signal to up-convert the Q channel signal to the desired RF range for transmission. The outputs of the I/Q channel mixers 105, 107 are combined at the input of an amplifier 111. The amplifier 111 asserts a combined amplified transmit signal to the input of an RF transmit circuit 113, which asserts an amplified RF signal to an antenna 117 through a transmit/receive (T/R) switch 115 when in a transmit mode.

The T/R switch 115 is selected to receive signals from the antenna 117 when in a receive mode and to provide the received signal to the input of an RF receive circuit 119. The RF receive circuit 119 provides the received signal to an amplifier 121, which asserts an amplified RF receive signal to respective inputs of an I channel mixer 123 and a Q channel mixer 125. The quadrature oscillator circuit 109 asserts the $I_C$ signal to another input of the I channel mixer 123 and asserts the $Q_C$ signal to another input of the Q channel mixer 125. The I channel mixer 123 splits the $I_C$ signal from an I channel receive signal RXI in the received signal and provides the RXI signal to a receiver system 127. In a similar manner, the Q channel mixer 125 splits the $Q_C$ signal from the Q channel receive signal RXQ in the received signal and provides the RXQ signal to another input of the receiver system 127.

The receiver system 127 generally performs the opposite functions of the transmitter system 103. In particular, the receiver system 127 includes analog-to-digital converters (ADCs) (not shown) that convert the analog RXI and RXQ signals to digital format. The receiver system 127 further includes a spreading decoder (not shown) that retrieves encoded packets and a packet decoder (not shown) that retrieves the packet payloads from the packets and generates a stream of received data signals. The received data signals from the receiver system 127 are provided to a receive input of the MAC device 101, which provides the received data signals to a corresponding device across the interface 129. The MAC interface 129 may be incorporated internally within a device, such as on a PC CARD or the like, or may be external with appropriate external connectors, such as according to USB or the like.

Figure 2:
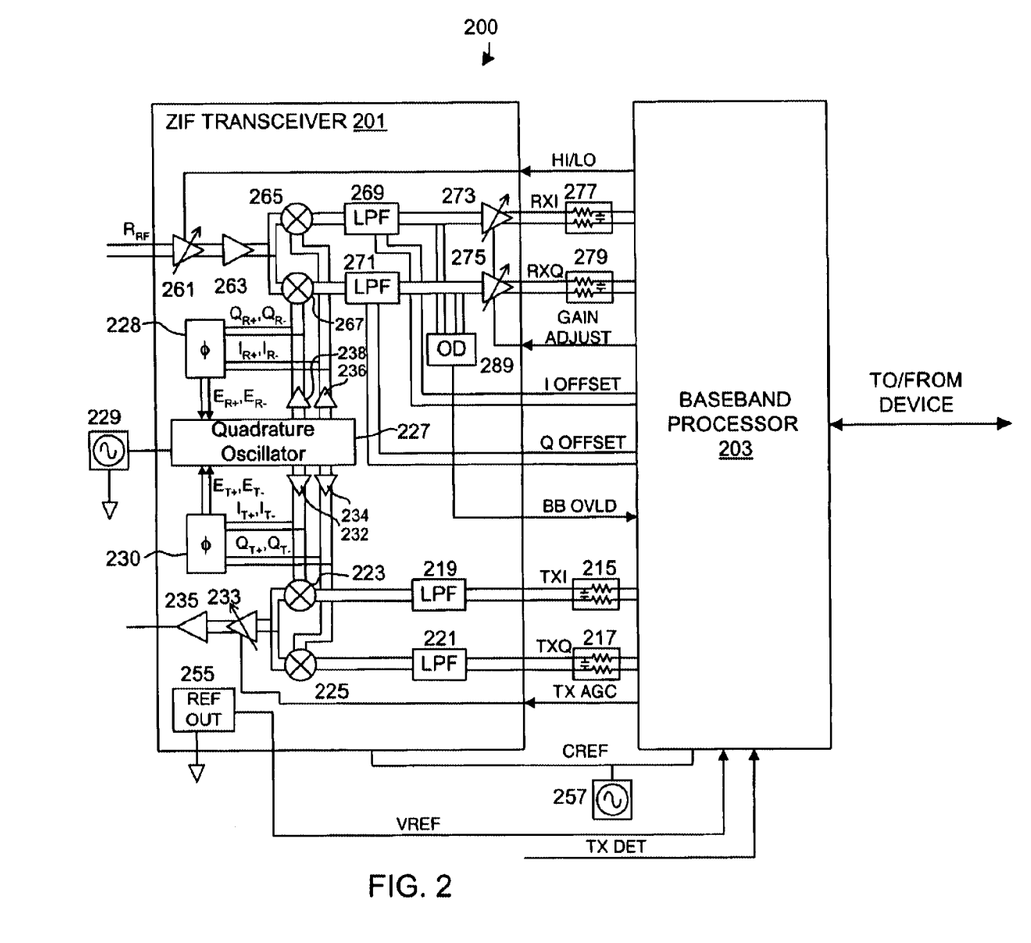
FIG. 2 is a more detailed schematic and block diagram of a wireless transceiver in a Zero Intermediate Frequency (ZIF) architecture and implemented according to an embodiment of the present invention.

FIG. 2 is a schematic and block diagram of a wireless transceiver 200 including a quadrature oscillator with phase error correction implemented according to an embodiment of the present invention, and represents a more detailed version of the wireless transceiver 100. It is understood that the wireless transceiver 200 is applicable to WLAN configurations or any other type of radio or wireless communications for other types of applications. The wireless transceiver 200 is implemented as a zero intermediate frequency (ZIF) architecture including a ZIF transceiver 201 and a baseband processor 203. The ZIF architecture enables a simplified configuration by entirely eliminating intermediate frequency (IF) logic and associated circuitry. In this manner, only two primary modules, chips, or ICs (transceiver and processor) are utilized in the ZIF architecture to enable wireless communications. The ZIF transceiver 201 includes a quadrature oscillator 227 with phase error correction as further described below. The baseband processor 203 performs many of the functions of the receiver system 127, the transmitter system 103 and the MAC device 101 and will not be described in detail.

The wireless transceiver 200 may utilize any desired carrier frequency and modulation technique to achieve any of several corresponding data throughputs. For example, the wireless transceiver 200 may be configured to operate according to the Institute of Electrical and Electronics Engineers (IEEE) 802.11b with a carrier frequency of approximately 2.4 gigahertz (GHz) and with data throughputs of 1, 2, 5.5 or 11 Megabits per second (Mbps). Alternatively, the wireless transceiver 200 may be configured according to IEEE 802.11a with a carrier frequency of approximately 5 GHz for data throughputs of 6, 12, 18, 24, 36 or 54 Mbps. In the embodiment shown, the wireless transceiver 200 operates in accordance with IEEE 802.11b at a carrier frequency of 2.4 GHz with data throughput rates of 1, 2, 5.5 or 11 Mbps. The direct sequence spread spectrum (DSSS) modulation technique is used in the embodiment shown, although it is understood that the present invention is not limited to any particular communication or modulation technique or standard.

Digital data sent from or received by the wireless transceiver 200 is processed by the baseband processor 203. For transmission, the baseband processor 203 performs the functions described above for the transmitter system 103 and converts data received into respective I and Q channel analog signals as previously described. The I channel analog output signal is provided to an anti-aliasing low-pass filter (AA LPF) 215, which provides an I channel transmit signal TX1 to an LPF 219 within the ZIF transceiver 201. The broadband processor 203 asserts the Q channel analog output signal to another AA LPF 217, which provides a Q channel transmit signal TXQ to the input of another LPF 221 within the ZIF transceiver 201.

An external voltage controlled oscillator (VCO) 229 provides an output local oscillator (LO) signal at approximately 4.8–5 GHz to an input of the quadrature oscillator 227. In one embodiment, a reference crystal is used to tune the VCO 229 by a voltage control to generate the 4.8–5 GHz LO signal. It is noted that the quadrature oscillator 109 collectively represents a simplified version of the quadrature oscillator 227 and the VCO 229. The quadrature oscillator 227 divides the LO signal by two and generates four separate 2.4 GHz carrier signals, including two in-phase (I) carrier signals, and two receive quadrature (Q) carrier signals, each comprising a differential signal. In particular, the I carrier signals include a differential I transmit carrier signal ($I_{T+}$, $I_{T-}$) and a differential I receive carrier signal ($I_{R+}$, $I_{R-}$) and the Q carrier signals include a differential Q transmit carrier signal ($Q_{T+}$, $Q_{T-}$) and a differential Q receive carrier signal ($Q_{R+}$, $Q_{R-}$). The I and Q carrier signals are intended to be 90 degrees out of phase with respect to each other. The I transmit carrier signal is provided to one input of an I channel mixer 223 (corresponding to mixer 105) through a driver 232, and the Q transmit carrier signal is provided to one input of a Q channel mixer 225 (corresponding to mixer 107) through another driver 234. The other input of the I channel mixer 223 receives the output of the LPF 219 and the other input of the Q channel mixer 225 receives the output of the LPF 221. The I channel mixer 223 combines the I carrier signal with the I channel transmit signal to up-convert the I channel from baseband to 2.4 GHz radio frequency (RF). The Q channel mixer 225 combines the Q carrier signal with the Q channel transmit signal to up-convert the Q channel from baseband to 2.4 GHz RF. The outputs of the I/Q channel mixers 223, 225 are combined at the input of a variable gain amplifier (VGA) 233. The VGA 233 asserts an amplified transmit signal to the input of a fixed-gain amplifier 235, which provides an output transmit signal to external circuitry for transmission, such as the RF transmit circuit 113 previously described.

A transmit detect (TX DET) feedback signal is asserted from external transmit circuitry, such as the RF transmit circuit 113, back to the baseband processor 203. The baseband processor 203 conducts a power control algorithm that detects the transmitted output signal via the TX DET signal and provides a feed forward transmit automatic gain control (TX AGC) signal to the ZIF transceiver 201 to control the gain of the VGA 233. Further, the ZIF transceiver 201 includes a voltage reference source 255 that provides a voltage reference (VREF) signal for the ZIF transceiver 201 and for the baseband processor 203. The VREF signal may be any convenient voltage, such as 1.2 volts or the like. Also, a clock source 257 provides a clock reference (CREF) signal to the ZIF transceiver 201 and the baseband processor 203.

An RF input signal $R_{RF}$ is received from external circuitry, such as the RF receive circuit 119 or the like, at the input of a variable LNA 261 within the ZEF transceiver 201. The LNA 261 asserts its output to the input of a fixed-gain LNA 263. The LNA 263 asserts the amplified RF receive signal to respective inputs of an I channel mixer 265 (corresponding to mixer 123) and a Q channel mixer 267 (corresponding to mixer 125). The quadrature oscillator 227 asserts the I receive carrier signal ($I_{R+}$, $I_{R-}$) to another input of the I channel mixer 265 through a driver 236 and the Q receive carrier signal ($Q_{R+}$, $Q_{R-}$) to another input of the Q channel mixer 267 through another driver 238. The I channel mixer 265 splits the I carrier frequency from the I channel output signal in the RF receive signal and provides the I channel output signal to an LPF 269. In a similar manner, the Q channel mixer 267 splits the Q carrier frequency from the Q channel output signal in the RF receive signal and provides the Q channel output signal to an LPF 271.

The output of the LPF 269 is provided to the input of a variable baseband automatic gain control (BB AGC) amplifier 273. In a similar manner, the LPF 271 asserts its output to the input of another BB AGC amplifier 275. The BB AGC amplifier 273 asserts an amplified I channel analog receive signal (RXI) to the input of an I channel receiver AA LPF 277, which asserts its output to an I channel input of the baseband processor 203. The BB AGC amplifier 275 asserts an amplified Q channel analog receive signal (RXQ) to the input of a Q channel AA LPF 279, which provides its output to a Q channel input of the baseband processor 203. The baseband processor 203 performs the functions of the receiver system 127, previously described, and generates a stream of received data signals.

An overload detector (OD) 289 within the ZIF transceiver 201 has first and second inputs coupled to the respective outputs of the LPF 269 and LPF 271 to detect an overload in the received input signal. The overload detector 289 asserts a baseband overload (BB OVLD) signal to a compensation system within the baseband processor 203. In this manner, the compensation system detects an overload of the received signal and asserts a HI/LO signal to control the variable LNA 261 of the ZIF transceiver 201. In the embodiment shown, the variable LNA 261 has an approximate 33 decibel (dB) step differential between a high gain (HI) and a low gain (LO). The gain is initially set high to detect weak signals and is switched to low gain upon certain conditions if the receive signal causes an overload condition as detected by the overload detector 289.

The compensation system also controls the gain of the received signal to a target power level by asserting an analog feedback gain control signal GAIN ADJUST to control the gain of both of the BB AGC amplifiers 273, 275. A single gain control signal is provided to both of the BB AGC amplifiers 273, 275 so that the gain of the I and Q channels of the receive signal appropriately track one another. The compensation system further asserts respective digital I and Q channel DC offset signals, I OFFSET and Q OFFSET to the LPF 269 and the LPF 271, respectively. In this manner, the compensation system attempts to measure and reduce or otherwise eliminate DC offsets in both the I and Q channels of the receive signal within the ZIF transceiver 201.

In the embodiment shown, a phase (φ) error detector 228 receives the differential Q receive carrier signal ($Q_{R+}$, $Q_{R-}$)

and the differential I receive carrier signal ($I_{R+}$, $I_{R-}$) and generates a differential receive phase error signal $E_R$ with positive and negative components ($E_{R+}$, $E_{R-}$). Likewise, another phase error detector 230 receives the differential Q transmit carrier signal ($Q_{T+}$, $Q_{T-}$) and the differential I receive carrier signal ($I_{T+}$, $I_{T-}$) and generates a differential transmit phase error signal $E_T$ with positive and negative components ($E_{T+}$, $E_{T-}$). Each phase error detector 228, 230 measures the relative phase error from quadrature between the corresponding differential I and Q carrier signals and converts the measured error to a phase error voltage, which is the DC component of the output signal of the phase error detector 228, 230. The phase error signals $E_R$ and $E_T$ are provided to the quadrature oscillator 227, which adjusts the I and Q carrier signals accordingly, as further described below.

In the embodiment shown, the phase error detector 228 is located near the receive mixers 265, 267 for a more accurate phase error determination at the receive circuitry. Likewise, the phase error detector 230 is located near the transmit mixers 223, 225 a more accurate phase error determination at the transmit circuitry. The use of separate detectors located at or near the mixers provides the highest level of accuracy for phase error detection and correction. It is noted, however, that various embodiments and configurations of the phase error detector function are contemplated as further described below. In one alternative, only one of the phase error detectors 228, 230 is used to provide one feedback phase error signal for both transmit and receive mixers. Alternatively, the phase error detectors 228, 230 are replaced by a single phase error detector. The single phase error detector may be located anywhere on the ZIF transceiver 201, such as at the input or within the quadrature oscillator 227. For half-duplex operation, a single switched phase error detector is contemplated as further described below.

Figure 3:
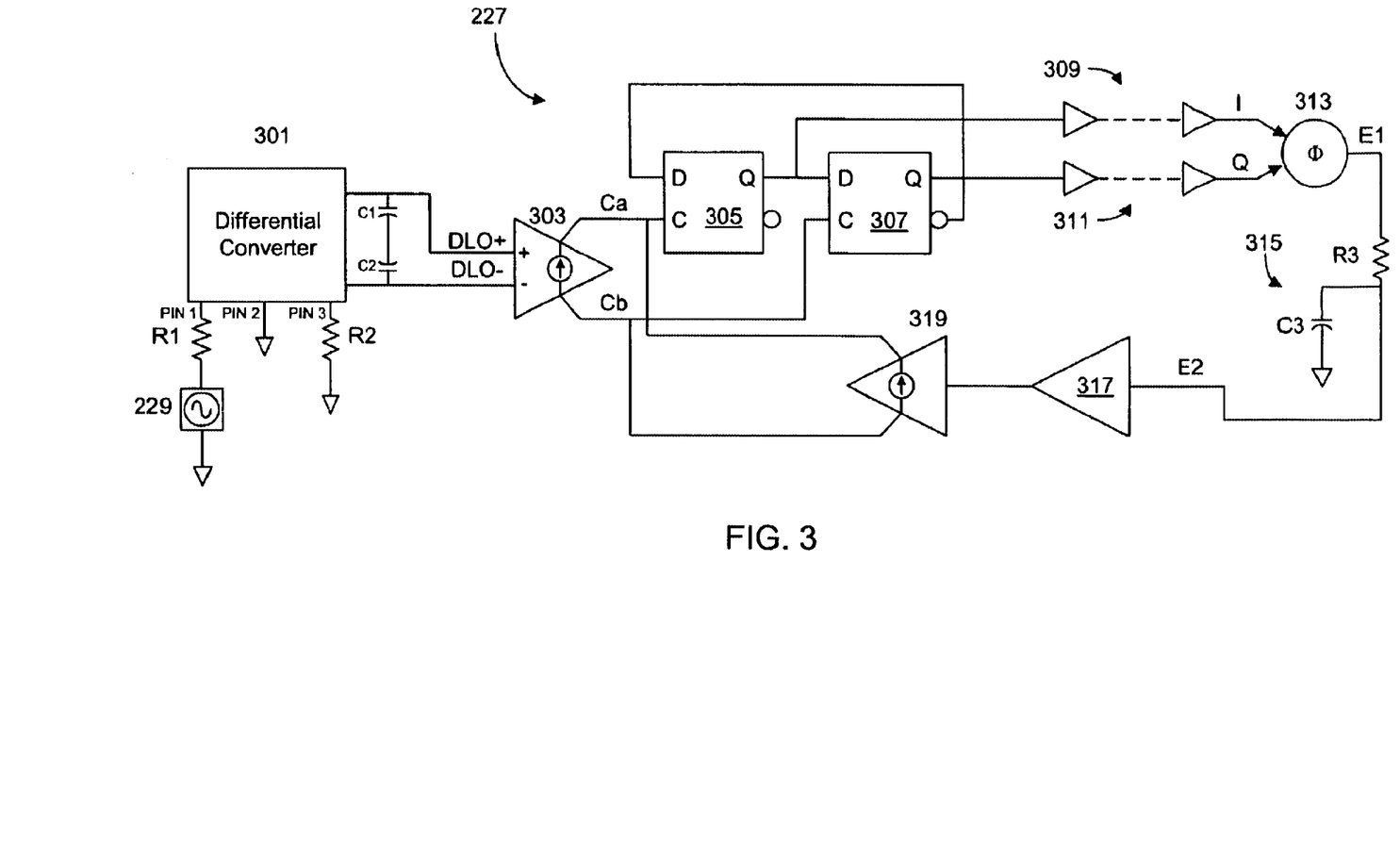
FIG. 3 is an architectural block diagram of an exemplary embodiment of the quadrature oscillator of FIG. 2 including a phase error correction loop in accordance with an embodiment of the present invention.

FIG. 3 is an architectural block diagram of an exemplary embodiment of the quadrature oscillator 227 including a phase error correction loop in accordance with an embodiment of the present invention. The VCO 229 asserts a single-ended sinusoidal LO signal to one side of an impedance matching resistor R1, having its other side coupled to one input/output (I/O) pin of a single-ended to differential converter 301 within the ZIF transceiver 201. The VCO 229 and the resistor R1 comprise an RF source. In the embodiment shown, the resistor R1 is a 50 ohm resistor. The single-ended to differential converter 301 uses three I/O pins, including the first pin PIN 1 driven by the RF source, a second pin PIN 2 coupled to ground to provide an RF common mode return, and a third pin PIN 3 coupled to one side of a dummy load resistor R2 having its other side coupled to ground. The load resistor R2 functions as a reference for the differential at RF, and in the embodiment shown is another 50 ohm resistor. The single-ended to differential converter 301 and the resistors R1, R2 as shown provide a reasonable conjugate match that converts the LO signal from single-ended to a differential LO signal DLO+, DLO−, by shunting a common mode portion of the differential signal, defined between PIN 1 and PIN 3, through PIN 2, which functions as the RF return back to the RF source. A pair of de-coupling capacitors C1 and C2 may be provided and coupled in series between the DLO+ and DLO− components of the differential LO output signal.

The DLO+, DLO− components of the differential output signal of the single-ended to differential converter 301 are provided to the positive and negative inputs, respectively, of a non-linear RF transconductor stage 303. The RF transconductor stage 303 asserts a first differential current clock signal Ca to the clock input of a D-type latch 305 and a second differential current clock signal Cb to the clock input of another D-type latch. The latches 305, 307 may alternatively be flip-flops or the like. The latches 305, 307 are coupled in a master-slave configuration in which the non-inverting output of the latch 305 is provided to the D input of the latch 307, and in which the inverting output of the latch 307 is coupled to the D input of the latch 305. In this manner, the master-slave latch 305, 307 is a quadrature generator that divides the clock frequency output of the RF transconductor stage 303 by two and generates a quadrature I and Q output. In particular, the non-inverting output of the latch 305 generates a differential I output and the non-inverting output of the latch 307 generates a differential Q output, each having approximately half the frequency of the first and second differential current clock signals Ca, Cb.

The differential I and Q outputs are provided through a chain of gain stages and/or buffers 309, 311, respectively. For simplicity of explanation, the term "buffer" will generally refer to one or more buffers, gain stages, amplifiers, drivers, etc. Each chain of buffers 309, 311 includes as many buffers or gain stages as necessary to provide desired output levels and drive capability to drive the respective mixers 223, 225, 265 and 267. Each chain of buffers 309, 311 can assume any form or topology. The particular gain through each chain of buffers 309, 311 is not a primary issue or a concern because the signal is generally of a timing nature, i.e., phase and phase differential. Therefore, the overall phase delay throughout each chain of buffers 309, 311 is of concern because it would otherwise be difficult to stabilize if a short loop acquisition time is desired. The chain of buffers 309 provides the differential I carrier signal for the mixers 107, 265 and the chain of buffers 307 provides the differential Q carrier signal for the mixers 105, 267.

It is noted that, depending upon particular configurations, each of the chain of buffers 309, 311 includes one or more buffers within the quadrature oscillator 227 and one or more buffers external to the quadrature oscillator 227. In one embodiment, for example, the chain of buffers 309 includes one or more buffers within the quadrature oscillator 227, one or more transmit buffers between the quadrature oscillator 227 and the mixer 223 and one or more receive buffers between the quadrature oscillator 227 and the mixer 265. The transmit buffers include the driver 232 used to drive the mixer 223 and the receive buffers include the driver 236 used to driver the mixer 265. In a similar manner, the chain of buffers 311 includes one or more buffers within the quadrature oscillator 227, one or more transmit buffers between the quadrature oscillator 227 and the mixer 225 including the driver 234 and one or more receive buffers between the quadrature oscillator 227 and the mixer 267 including the driver 238. The number of buffers in the transmit and receive chains need not be equal and may depend upon the particular location of the transmit and receive circuitry on the chip. It is further noted that in a half-duplex communication configuration, the external receive buffers may be powered down during transmit mode of operation whereas the external transmit buffers may be powered down during receive mode of operation to save power and to conserve energy.

The differential I and Q carrier signals are also provided to a quadrature phase error detector 313, which measures the relative phase error from quadrature between the differential I and Q carrier signals and converts this error to a phase error signal E1. The phase error detector 313 represents either or both of the phase error detectors 228, 230 or a single phase error detector located within the quadrature oscillator 227 in alternative embodiments. The E1 signal is the DC component of the output signal of the phase error detector 313. Although the E1 signal is illustrated as a single-ended signal, it may be single-ended or differential where either embodiment is contemplated. The E1 signal is provided through an RC filter 315, which rejects the LO fundamental frequency and its harmonics to provide a band-limited phase error signal E2. In a similar manner as with the E1 signal, the E2 signal is illustrated as a single-ended signal, although it may be single-ended or differential where either embodiment is contemplated. In the embodiment shown, the RC filter 315 includes a series resistor R3 coupled between the E1 and E2 signals and a capacitor C3 coupled between E2 and ground. The RC filter 315 may be single-ended or differential depending upon the E1 and E2 signals. The RC filter 315 is used to reject any extraneous large LO signals from the small phase error signal to provide linear feedback in the loop. The RC filter 315 adds a pole at about a frequency "fp", which is not the dominant pole of the loop. In one embodiment, fp is approximately 100 megahertz (MHz). Variations of this architecture may include a phase detector that does broadband rejection of the LO and its harmonics by taking advantage of the differential nature of the I and Q carrier signals which eliminates the fp pole from the loop, thus allowing faster acquisition times.

The band-limited phase error signal E2 is then provided to an input of a high gain stage amplifier or operational amplifier (opamp) 317. The output of the opamp 317 is provided to an input of a linear transconductance stage amplifier 319. The current outputs of the transconductance stage amplifier 319 are summed with the Ca and Cb signals to complete the loop.

Figure 4:
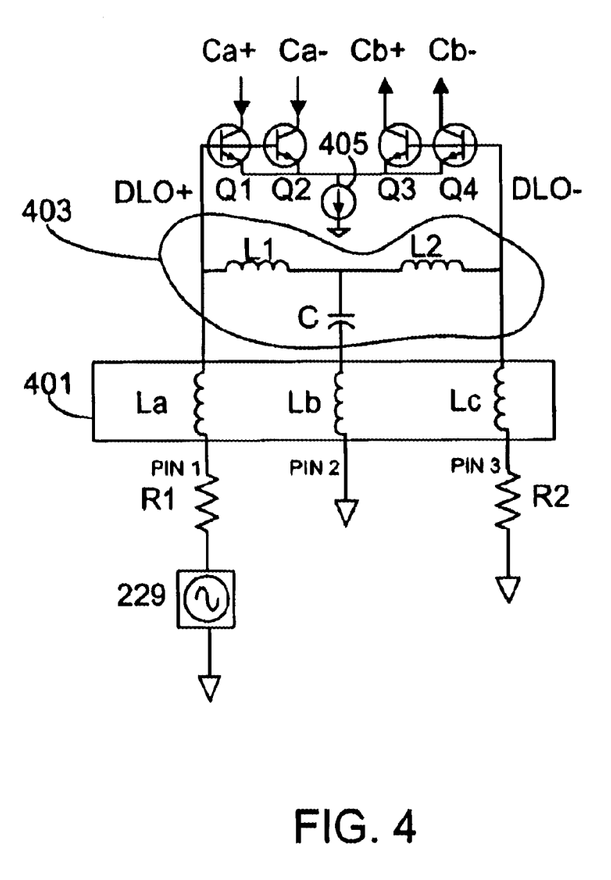
FIG. 4 is a more detailed schematic diagram of the chip or integrated circuit (IC) package of the transceiver of FIG. 2 including the single-ended to differential converter and an RF transconductor stage.

FIG. 4 is a more detailed schematic diagram of the chip or integrated circuit (IC) package 401 of the ZIF transceiver 201 including the single-ended to differential converter 301 and the RF transconductor stage 303. Each of the pins PIN 1, PIN 2 and PIN 3 of the IC package 401 includes a corresponding inductance La, Lb and Lc, respectively. The inductance La of PIN 1 develops the DLO+ signal, which is provided to one end of an inductor L1 of a common mode shunt 403 and to the bases of two common-emitter transistors Q1 and Q2. The inductance Lc of PIN 3 develops the DLO− signal, which is provided to one end of another inductor L2 of the common mode shunt 403 and to the bases of another two common-emitter transistors Q3 and Q4. The other ends of the inductors L1 and L2 are coupled together and to one end of a capacitor C of the common mode shunt 403. The other end of the capacitor C is coupled to PIN 2 through its inductance Lb. The transistors Q1–Q4 are bipolar type transistors in the embodiment shown. The emitters of the transistors Q1–Q4 are coupled together and to one terminal of a current source 405, having its other terminal coupled to ground. The collectors of the transistors Q1 and Q3 develop the Ca differential current clock signal including components Ca+ and Ca−, respectively. The collectors of the transistors Q2 and Q4 develop the Ca differential current clock signal including components Cb+ and Cb−, respectively. In this manner, the differential LO signal DLO+, DLO− is converted to two pairs of differential currents Ca+, Ca− and Cb+, Cb−.

Figure 5:
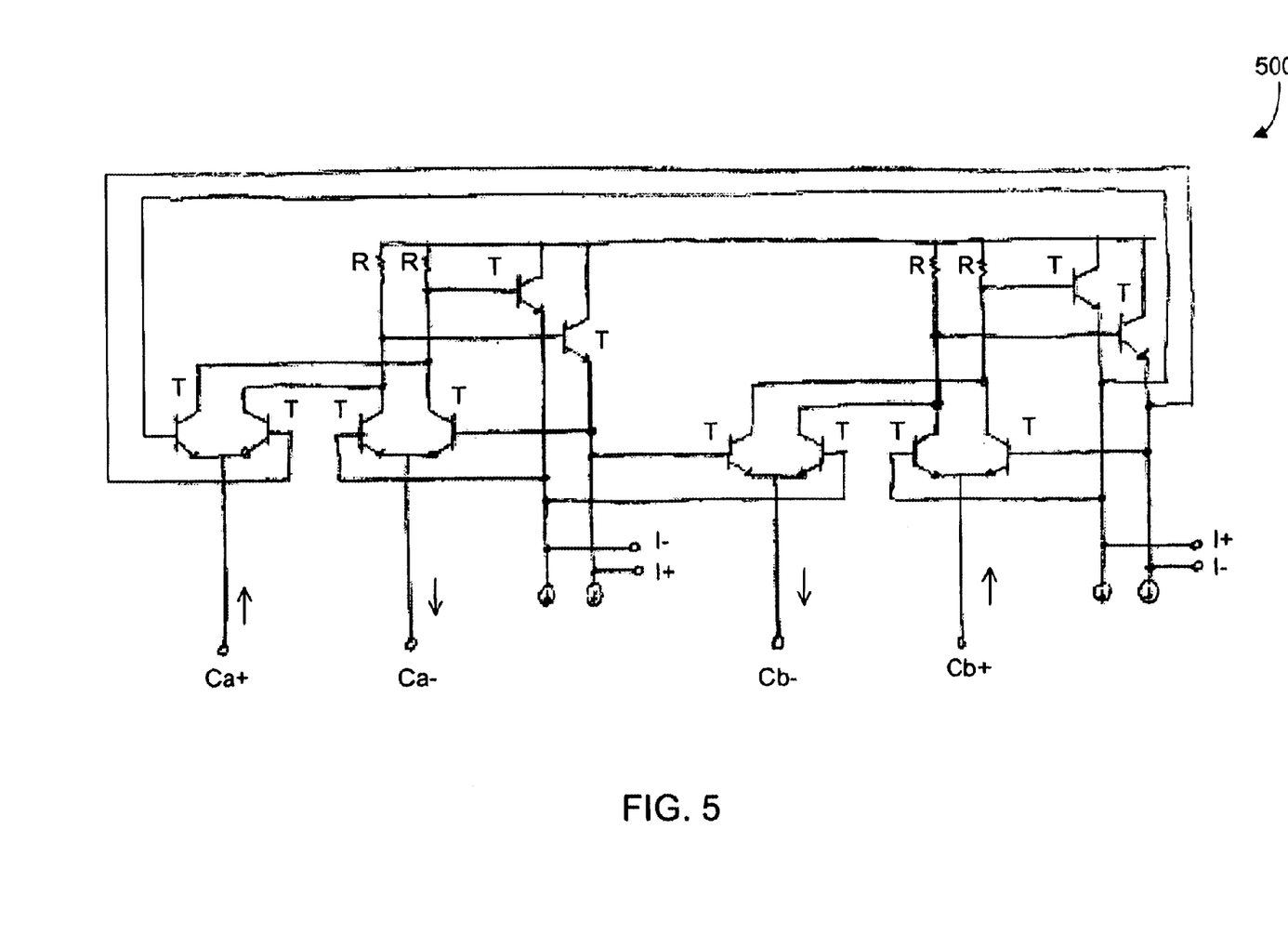
FIG. 5 is more schematic diagram of an exemplary emitter-coupled logic (ECL) master-slave clock circuit including bipolar transistors and resistors for implementing the master-slave latches of FIG. 3.

FIG. 5 is a schematic diagram of an exemplary emitter-coupled logic (ECL) master-slave clock circuit 500 including bipolar transistors (T) and resistors (R) for implementing the master-slave latches 305, 307. The clock circuit 500 receives the two pairs of differential currents Ca+, Ca− and Cb+, Cb− and generates differential I and Q clock outputs with respective components I+, I− and Q+, Q−. This circuit is generally known to those having skill in the relevant art and will not be further described. Any suitable divide-by-two clock circuit will suffice.

Figure 6:
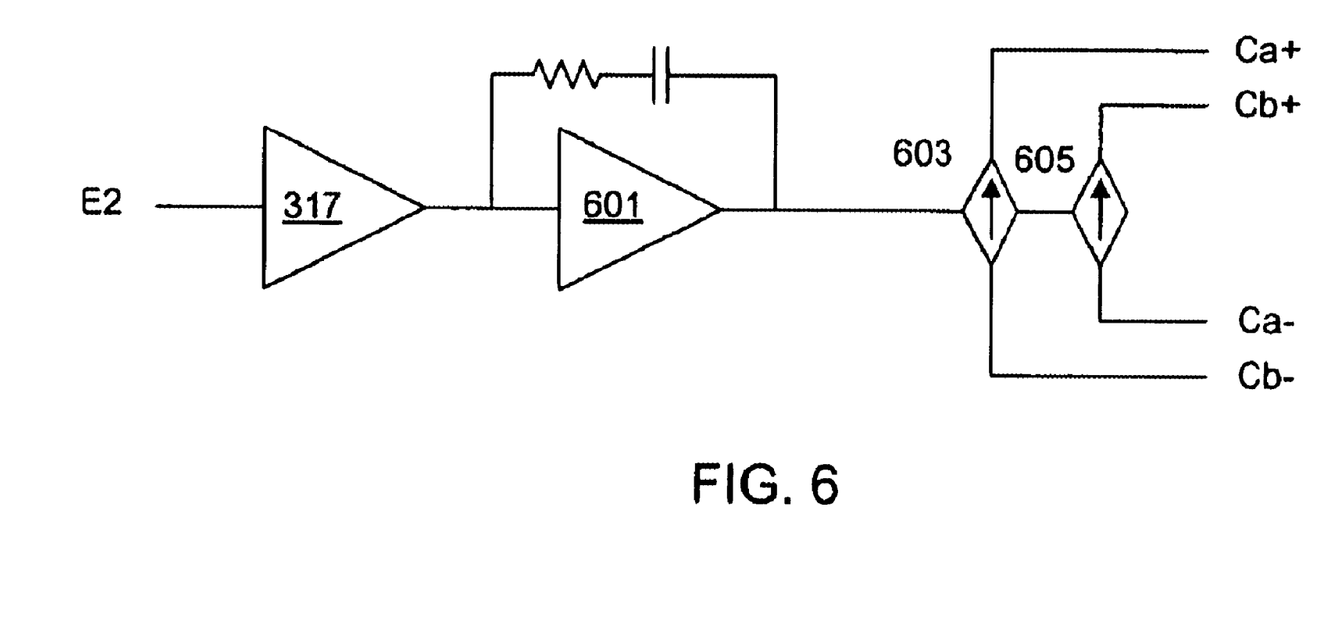
FIG. 6 is a more detailed schematic diagram of the feedback stage between the opamp of FIG. 3 receiving the feedback error signal and summation with the differential clock input currents.

FIG. 6 is a more detailed schematic diagram of the feedback stage between the opamp 317 receiving the E2 signal and the summation with the differential currents Ca+, Ca− and Cb+, Cb−. The opamp 317 is coupled open-loop with its output provided to the input of a Miller-compensated second stage amplifier 601. The Miller compensation is illustrated as a series RC feedback circuit between the input and output of the amplifier 601. These amplifiers set the dominant pole and the acquisition time of the total feedback loop. These amplifiers also set the steady state corrected phase error. A larger gain gives a smaller steady state corrected phase error. If the gain is large enough, the corrected phase error of the closed loop is set only by the accuracy of the phase detector. This allows relaxation of the accuracy of all the other blocks such as the chains of buffers 309, 311 and the divide-by-2 functions in terms of phase offsets. Also, the larger this gain, the greater the linearity of the closed loop operation due to the nonlinear distortion nulling effect of high gain negative feedback amplifiers.

The amplifier 601 converts that amplified phase error signal E2 to a current, which, is summed with each of the differential currents Ca+, Ca− and Cb+, Cb− at summing junctions 603, 605 at the input to the master-slave latches 305, 307. In one embodiment, the amplifier 601 is a transconductor including metal-oxide semiconductor field-effect transistors (MOSFETs) current sources that each convert voltage to current. The summing junctions 603, 605 may comprise wired junctions for combining a DC feedback component to the AC oscillator signals. It is noted that the E2 signal, the opamp 317 and the amplifier 601 of the feedback stage are shown as single-ended, although they may be single-ended or differential.

Figure 9:
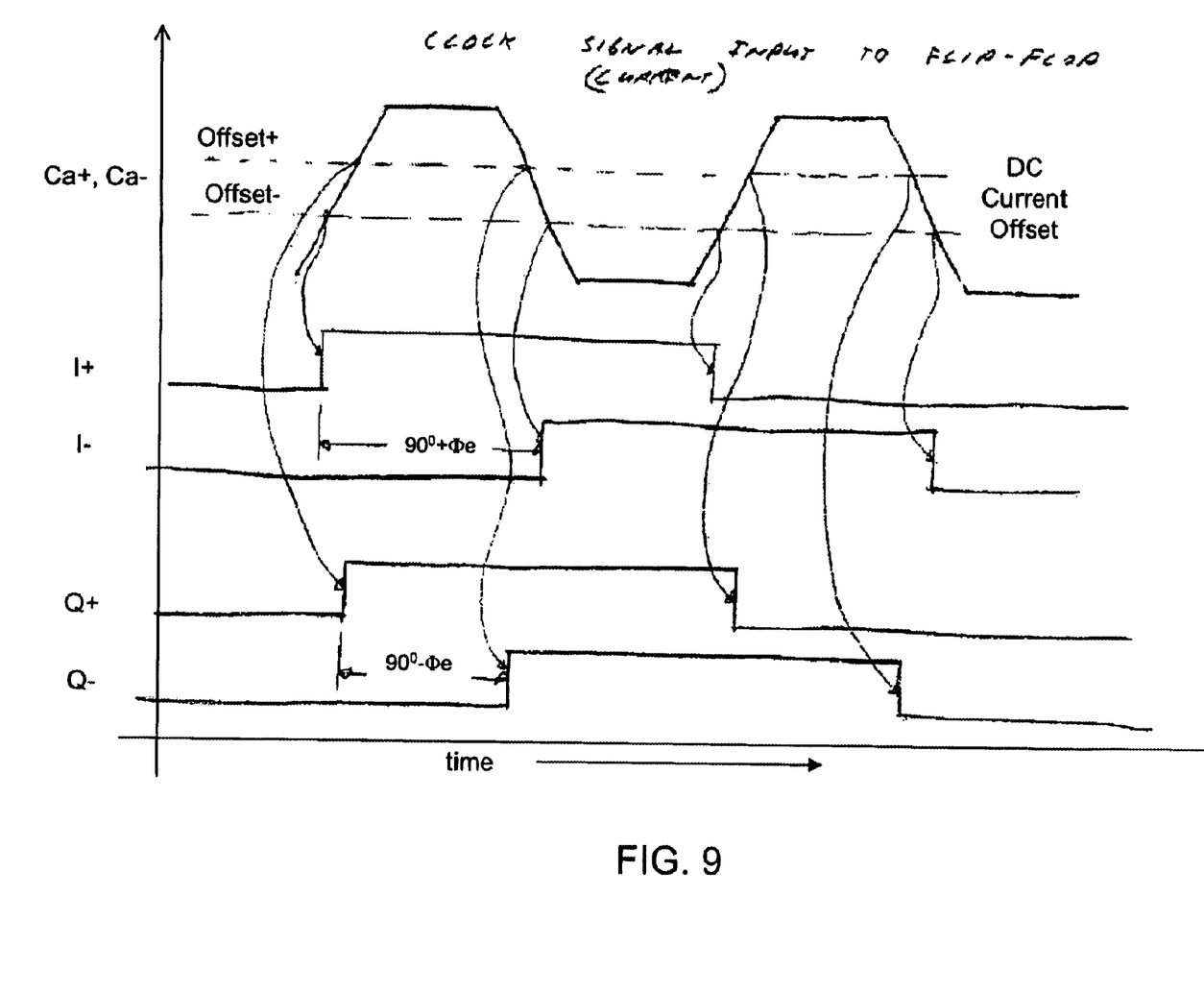
FIG. 9 is a graph diagram plotting the clock input current signals and the resulting quadrature outputs of the clock circuit of FIG. 5 versus time.

FIG. 9 is a graph diagram plotting the clock inputs Ca+, Ca−, and the resulting quadrature outputs I+, I−, Q+ and Q− of the clock circuit 500 versus time. As shown, the phase error currents from the feedback loop produce a DC offset to the AC input differential clock signals Ca+, Ca− (and Cb+, Cb−), which is in the form of a current at this point and produces a phase offset from quadrature. This phase offset is a function of the clock signal rise and/or fall times and the amount of DC offset. This transfer function from current offset to phase offset is complicated but can be estimated by measuring the slew rate of the clock signal currents and making a linearizing assumption that the rising edges have a constant slew rate as opposed to an exponential slew rate as would be the case with a purely linear lumped element system. The switching characteristics of a bipolar junction transistors (BJT) tend to have a constant slew rate due to the heavy nonlinear activity going on during the switching of the device. Therefore, this is a good assumption and experimentation shows a reasonably large linear dynamic range of this transfer block.

In summary, the phase error detector 313 measures the phase error from quadrature at the receive/transmit mixer LO inputs. The feedback amplifier applies an inverted (negative feedback) and amplified version of this signal back to the divide-by-2 clock circuitry. This pulls the phase back towards quadrature, thus reducing the total phase error incurred by any imperfections in the single-ended to differential conversion, divide-by-2 and inherent mismatches in delay between the I and Q LO driver/buffer chains, which are necessary for the appropriate mixer performance. If the total loop gain is large enough, the steady state corrected phase error is negligible and the only phase error component that remains, if any, is from the phase error detector itself. Therefore, the phase error from quadrature is only as large as the phase error offsets produced by the phase error detector because the loop nulls out other phase offset contributors.

Figure 7:
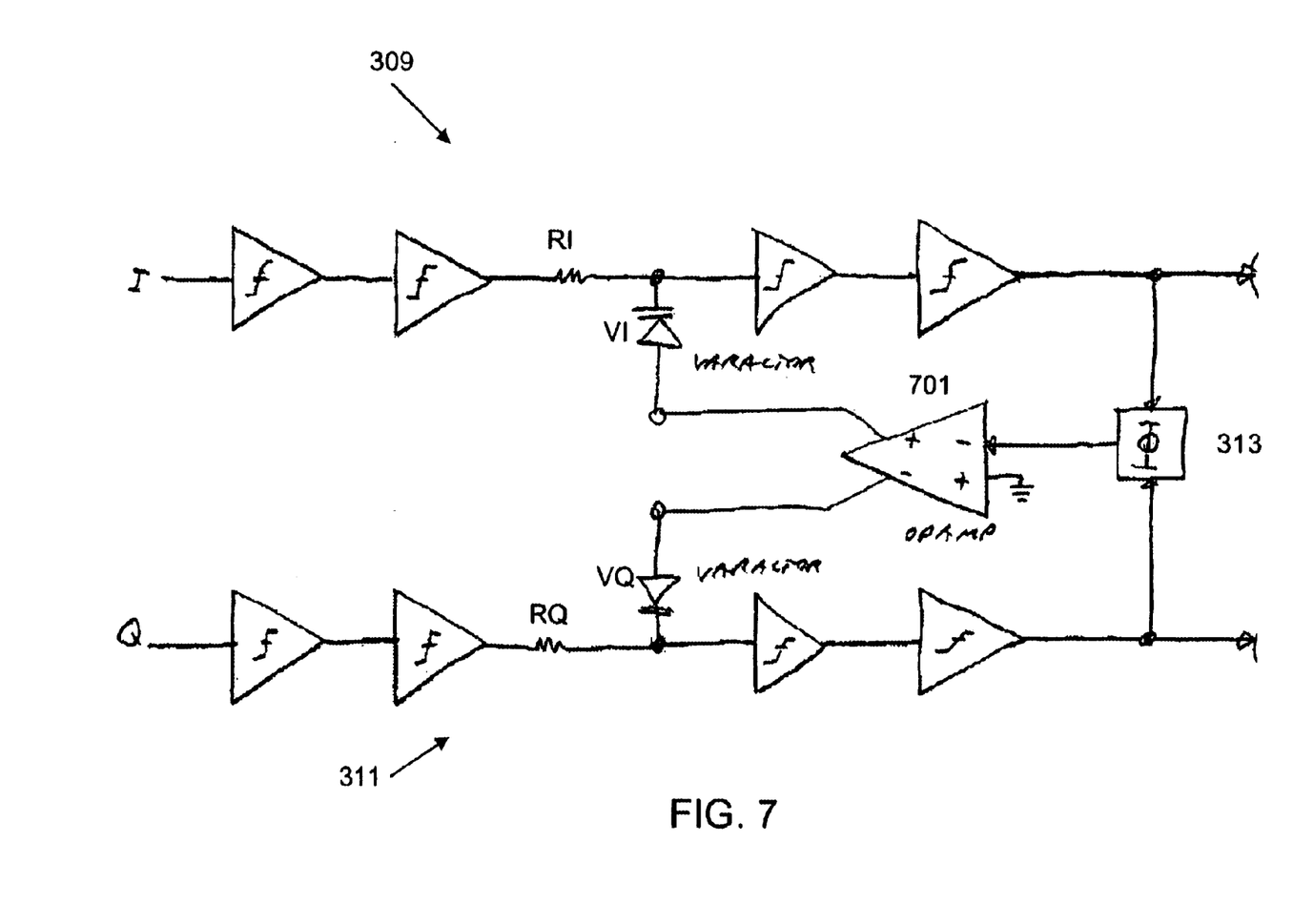
FIG. 7 is a block diagram of an alternative embodiment in which the loop is closed elsewhere, such as within the chain of buffers of FIG. 3.

FIG. 7 is a block diagram of an alternative embodiment in which the loop is closed elsewhere, such as within the chain of buffers 309, 311. In particular, instead of closing the loop at the clock input of the master-slave latch 305, 307 using DC current offset, the loop is closed anywhere in the chain of buffers using tunable delay stages. In the embodiment shown, a resistor RI is placed in series at a junction between two stages of the chain of buffers 309, and the cathode of a tunable varactor VI is coupled to the junction between the resistor RI and the input to the next stage of the chain of buffers 309. Likewise, another resistor RQ is placed in series at a junction between two stages of the chain of buffers 311, and the cathode of another tunable varactor VQ is coupled to the junction between the resistor RQ and the input to the next stage of the chain of buffers 311. The output of the phase error detector 313 is provided to the input of an amplifier 701, such as an opamp or the like, which has its non-inverting output coupled to the anode of the varactor VI and its inverting output coupled to the anode of the varactor VQ.

In operation, the varactors VI and VQ operate as capacitive tuning elements which give a tunable RC delay response for the respective I and Q carrier signals. The voltage output of the amplifier 701 is used to drive the tuning voltage of the varactors. In one embodiment, for example, if the center time constant of the RC structure is set to achieve a 3 dB roll-off at the fundamental LO frequency, it provides the maximum gain out of this transfer block. One potential drawback is a tendency to filter and phase-shift the upper level harmonics of the LO signal. This tendency is usually not a problem, however, since the following buffer stages are usually a set of limiting amplifiers, which tend to square up the edges of the LO signal to compensate for the filtering effect.

Figure 8:
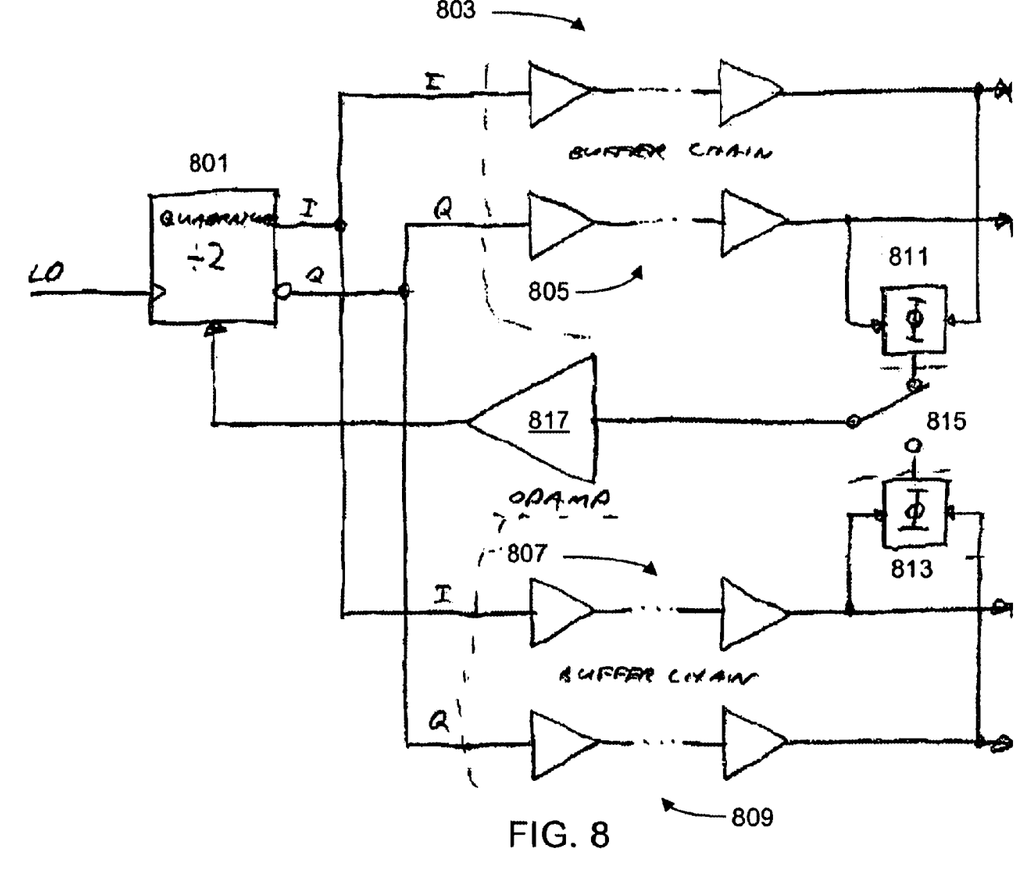
FIG. 8 is a block diagram illustrating another alternative embodiment illustrating the use of two switchable phase error detectors in a half-duplex radio system.

FIG. 8 is a block diagram illustrating another alternative embodiment illustrating the use of two switchable phase error detectors in a half-duplex radio system. In most half-duplex radios, the transmit or receive sections are powered up or down for conservation of supply current, depending on whether the radio is transmitting or receiving at a particular time. In this manner, both transmit and receive mixers may need their own dedicated set of buffer chains as well as interconnecting routing. As shown, a divide by two quadrature oscillator 801 is shown providing an I carrier signal to an I channel transmit buffer chain 803 and an I channel receive buffer chain 807. Likewise, the quadrature oscillator 801 provides a Q carrier signal to a Q channel transmit buffer chain 805 and a Q channel receive buffer chain 809. The buffer chains 803–809 drive the respective transmit and receive mixers 223–227, respectively, as shown.

A first phase error detector 811 detects that phase error of the I and Q transmit carrier signals and a second phase error detector 813 detects that phase error of the I and Q receive carrier signals. A mode switch 815 couples the phase error detector 811 to the input of an opamp 817 in transmit mode and couples the phase error detector 813 to the input of the opamp 817 in receive mode. These two phase detectors 811, 813 are powered up and down with their respective transmit or receive chain and can be analog summed at much lower frequencies at the input to the opamp 817. This may require some acquisition time between transmit and receive modes. Such switching can usually be performed while the receive or transmit chain is acquiring.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A quadrature oscillator with phase error correction, comprising:
    a local oscillator that generates a single-ended clock signal;
    a single-ended to differential converter, coupled to the local oscillator, that converts the single-ended clock signal to a differential clock signal;
    a quadrature generator, coupled to the converter, that converts the differential clock signal into an in-phase (I) carrier signal and a quadrature (Q) carrier signal;
    a phase error detector, coupled to the quadrature generator, that measures a phase error between the I and Q carrier signals and that provides a phase error signal; and
    a feedback amplifier, coupled to the phase error detector and the quadrature generator, that modifies the differential clock signal based on measured phase error.

2. The quadrature oscillator of claim 1, wherein the single-ended to differential converter includes a second stage that generates a pair of differential clock signals.

3. The quadrature oscillator of claim 1, wherein the quadrature generator divides the frequency by two.

4. The quadrature oscillator of claim 1, wherein the feedback amplifier applies the measured phase error as a DC offset to an AC differential clock signal.

5. The quadrature oscillator of claim 1, further comprising:
    the local oscillator asserting the single-ended clock signal as a voltage signal;
    the single-ended to differential converter asserting the differential clock signal as a differential voltage signal;
    a transconductor, coupled to the single-ended to differential converter and the quadrature generator, that converts the differential clock voltage signal into two pairs of differential current clock signals; and
    the quadrature generator comprising a master-slave latch configuration, coupled to the transconductor, that generates I and Q current signal outputs from the two pairs of differential current clock signals.

6. The quadrature oscillator of claim 5, wherein the transconductor comprises:
    a dual pair of common-emitter coupled transistors, each pair having a base input receiving a component of the differential clock signal and each pair having a pair of collectors generating a corresponding one of the two pairs of differential current clock signals; and
    a current source coupled between the emitters of each of the dual pair of transistors and ground.

7. The quadrature oscillator of claim 5, further comprising:
    a first chain of buffers that amplifies the I current signal output to provide the I carrier signal; and
    a second chain of buffers that amplifies the Q current signal output to provide the Q carrier signal.

8. The quadrature oscillator of claim 7, wherein the phase error detector generates a phase en-or voltage indicative of phase error between the I and Q carrier signals.

9. The quadrature oscillator of claim 8, wherein the feedback amplifier comprises:
- a transconductance stage, coupled to the phase en-or detector and the quadrature generator, that converts a phase en-or voltage into a correction current and that adds the correction current to each of the two pairs of differential current clock signals.

10. The quadrature oscillator of claim 9, wherein the transconductance stage comprises MOSFET current sources.

11. The quadrature oscillator of claim 9, wherein the feedback amplifier further comprises:
- an RC filter, coupled to the phase en-or detector; and
- an amplifier stage, coupled to the RC filter and the transconductor stage, that amplifies the phase en-or voltage.

12. The quadrature oscillator of claim 1, wherein the phase error detector comprises:
- a first mode buffer, coupled to the quadrature generator, that generates first mode I and Q carrier signals;
- a second mode buffer, coupled to the quadrature generator, that generates second mode I and Q carrier signals;
- a first phase en-or detector that measures a phase error between the first mode I and Q carrier signals and that provides a first mode phase error signal;
- a second phase error detector that measures a phase error between the second mode I and Q carrier signals and that provides a second mode phase error signal; and
- a mode switch, coupled to the first and second phase error detectors and the feedback amplifier, that couples the first phase error detector to the feedback amplifier in a first mode and that couples the second phase error detector to the feedback amplifier in a second mode.

13. A quadrature local oscillator with phase error correction, comprising:
- a single-ended to differential converter that converts a single-ended clock signal to a differential clock signal;
- a transconductor, coupled to the single-ended to differential converter, that converts the differential clock signal into a pair of differential clock signals;
- a quadrature generator, coupled to the transconductor, that converts the pair of differential clock signals into an in-phase (I) clock signal and a quadrature (Q) clock signal;
- a first chain of buffers, coupled to the quadrature generator, that develops an I carrier signal as a corrected version of the I clock signal, the first chain of buffers having an intermediate feedback junction;
- a second chain of buffers, coupled to the quadrature generator, that develops a Q carrier signal as a corrected version of the Q clock signal, the second chain of buffers having an intermediate feedback junction;
- a phase error detector, coupled to the first and second chain of buffers, that measures a phase error between the I and Q carrier signals and that provides a phase error signal;
- a feedback amplifier, coupled to the phase error detector, that receives the phase error signal and that generates a differential feedback signal; and
- a pair of tuning elements, each coupled to the feedback amplifier and a respective one of the intermediate feedback junctions of the first and second chain of buffers.

14. The quadrature local oscillator of claim 13, wherein each of the pair of tuning elements comprises a tunable RC circuit.

15. The quadrature local oscillator of claim 13, wherein each of the pair of tuning elements comprises:
- a series resistance coupled between successive buffers of the chain of buffers; and
- a tunable varactor coupled to the resistance and the feedback amplifier.

16. A quadrature oscillator with phase error correction, comprising:
- a clock generator that provides a single-ended clock signal;
- a clock splitter, coupled to the clock generator, that splits the single-ended clock signal into first and second differential clock signals;
- a first phase shifting network, coupled to the clock splitter, that develops a first differential carrier signal based on the first differential clock signal;
- a second phase shifting network, coupled to the clock splitter, that develops a second differential carrier signal based on the second differential clock signal, wherein the second differential carrier signal is intended to be one quarter phase shifted relative to the first differential carrier signal; and
- a phase detector, coupled to the first and second phase shifting networks, that asserts a phase en-or signal based on relative phase between the first and second differential carrier signals used to control the phase shifting networks.

17. The quadrature oscillator of claim 16, further comprising:
- a combiner, coupled to the phase detector and the clock splitter, that adjusts the first and second differential clock signals based on the phase error signal.

18. The quadrature oscillator of claim 16, further comprising:
- the first and second phase shifting networks each developing a respective one of first and second intermediate carrier signals; and
- a combiner, coupled to the phase detector and the first and second phase shifting networks, that adjusts the first and second intermediate carrier signals based on the phase error signal.

19. A method of generating quadrature signals with phase error correction, comprising:
- generating a clock signal;
- converting the clock signal into a, differential clock signal;
- splitting the clock signal into first and second clock signals;
- developing an in-phase (I) differential carrier signal and a quadrature phase (Q) differential carrier signal based on the first and second clock signals;
- detecting phase error between the I and Q differential carrier signals and generating a phase error feedback signal; and adjusting the phase differential between the I and Q differential earner signals based on the phase error feedback signal.

20. The method of claim 19, wherein the adjusting the phase differential comprises combining the phase error feedback signal with the first and second clock signals.

21. The method of claim 19, further comprising:
generating intermediate I and Q differential carrier signals within a chain of buffers; and
the adjusting the phase differential comprises combining the phase error feedback signal with the intermediate I and Q differential carrier signals.

* * * * *